US012672411B2

(12) United States Patent (10) Patent No.: US 12,672,411 B2
Dussaigne et al. (45) Date of Patent: Jun. 30, 2026

(54) METHOD FOR PRODUCING A NATIVE EMISSION MATRIX

(71) Applicant: COMMISSARIAT A L'ENERGIE ATOMIQUE ET AUX ENERGIES ALTERNATIVES, Paris (FR)

(72) Inventors: Amélie Dussaigne, Grenoble (FR); Patrick Le Maitre, Grenoble (FR); Helge Haas, Grenoble (FR); Ludovic Dupre, Grenoble (FR); Carole Pernel, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 371 days.

(21) Appl. No.: 18/570,968

(22) PCT Filed: Jun. 13, 2022

(86) PCT No.: PCT/FR2022/051119
§ 371 (c)(1),
(2) Date: Dec. 15, 2023

(87) PCT Pub. No.: WO2022/263756
PCT Pub. Date: Dec. 22, 2022

(65) Prior Publication Data
US 2024/0297204 A1 Sep. 5, 2024

(30) Foreign Application Priority Data

Jun. 16, 2021 (FR) ...................................... 2106386

(51) Int. Cl.
H10H 29/14 (2025.01)
(52) U.S. Cl.
CPC .......... H10H 29/14 (2025.01); H10H 29/142 (2025.01)

(58) Field of Classification Search
CPC ...... H10H 29/011; H10H 29/10; H10H 29/14; H10H 29/142; H10H 29/80; H10H 20/815; H10H 20/817
See application file for complete search history.

(56) References Cited

U.S. PATENT DOCUMENTS

| | | | |
|---|---|---|---|
| 11,749,779 B2 | 9/2023 | Pernel et al. | |
| 2023/0053213 A1* | 2/2023 | Ali ........................ | H10H 20/817 |
| 2024/0063340 A1* | 2/2024 | Keller ................... | C30B 29/403 |

FOREIGN PATENT DOCUMENTS

| | | |
|---|---|---|
| EP | 3840016 A1 | 6/2021 |
| EP | 3840065 A1 | 6/2021 |
| WO | 2021050731 A1 | 3/2021 |

OTHER PUBLICATIONS

Search Report for International Application No. PCT/FR2022/051119 mailed Sep. 29, 2022.

(Continued)

*Primary Examiner* — Eduardo A Rodela
(74) *Attorney, Agent, or Firm* — Chrisman Gallo Tochtrop LLC

(57) ABSTRACT

A method for producing a native emission matrix including the following steps of:
  a) providing a base structure including, successively, a substrate, a GaN layer, a doped In(x)GaN layer where x is from 0 to 8%, and an unintentionally doped In(x)GaN epitaxial regrowth layer;
  b) patterning mesas in the base structure, the mesas comprising a portion of the doped In(x)GaN layer and the unintentionally doped In(x)GaN epitaxial regrowth layer, whereby the mesas are electrically interconnected with one another;
  c) porosifying electrochemically the doped In(x)GaN layer; and
  d) carrying out a first LED structure and a second LED structure on the mesas, whereby a first LED having a (Continued)

first emission wavelength, and a second LED having a second emission wavelength, respectively, are obtained, and a native emission matrix is formed.

15 Claims, 6 Drawing Sheets

(56) References Cited

OTHER PUBLICATIONS

Even et al., "Enhanced In incorporation in full InGaN heterostructure grown on relaxed InGaN pseudo-substrate"; Appl. Phys. Lett., vol. 110, No. 262103, (2017).

Jang et al., "Electrical and structural properties of GaN films and GaN/InGaN light-emitting diodes grown on porous GaN templates fabricated by combined electrochemical and photoelectrochemical etching", Journal of Alloys and Compounds, vol. 589, pp. 507-512, (2014).

* cited by examiner

METHOD FOR PRODUCING A NATIVE EMISSION MATRIX

CROSS-REFERENCE TO RELATED APPLICATIONS

This is a National Stage application of PCT international application PCT/FR2022/051119, filed on Jun. 13, 2022, which claims the priority of French Patent Application No. FR 2106386, filed Jun. 16, 2021, both of which are incorporated herein by reference in their entirety.

TECHNICAL FIELD

The present invention concerns the general field of colour micro-displays.

The invention relates to a method for producing a native emission matrix.

The invention further relates to a native emission matrix obtained in this way.

The invention can be applied in numerous industrial fields, and in particular in the field of colour micro-displays containing micro-LEDs with a pitch of less than 10 μm.

PRIOR ART

Colour micro-displays comprise red, green and blue pixels (RGB pixels).

Blue and green pixels can be produced from nitride materials and red pixels from phosphor materials. To combine these three types of pixel on the same substrate, a so-called "pick and place" technique is typically used. However, in the case of micro-displays with pixels of less than 10 μm, this technique can no longer be used, not only due to alignment problems but also due to the time required to implement such a technique on this scale.

Another solution consists in converting colours with quantum dots (QDs) or nanophosphors. However, the deposition of these materials on pixels of small dimensions is difficult to control and the flow resistance thereof is insufficient.

The possibility of obtaining the three RGB pixels in a native manner with the same family of materials and on the same substrate is therefore essential. InGaN is the most promising material in this respect. This material can in fact theoretically cover the entire visible spectrum, depending on the indium concentration thereof. Blue micro-LEDs containing InGaN already show high luminance, far greater than their organic counterparts. In order to emit at wavelengths for green light, the quantum wells (QWs) of the LED must contain at least 25% indium and, to emit red light, they must contain at least 35% indium. Unfortunately, the quality of the InGaN material deteriorates, when in the presence of more than 20% In, as a result of the low miscibility of InN in GaN, as well as of the high compressive strain inherent to the growth of the InGaN on GaN active region.

The possibility of reducing the overall strain in GaN/InGaN structures is thus essential.

Several solutions have been proposed to overcome this problem.

A first solution consists in forming nanostructures, such as nanowires or pyramids, in order to be able to relax the strains through the free edges. The axial nanowires can be grown by molecular beam epitaxy (MBE). In practice, the low growth temperature used in growth by MBE leads to low internal quantum efficiencies (IQEs). Pyramids are used to curve dislocations. In particular, complete pyramids have semi-polar planes conducive to the incorporation of In and to the reduction of the internal electrical field of the active region. For truncated pyramids, the truncated faces allow the quantum wells to grow on the c-plane, which leads to a more homogeneous emission compared with an emission along the semi-polar planes of a complete pyramid. Alternatively, growth can also take place in a planar manner on planes other than the c-face of the wurtzite structure, such as growth on the semi-polar planes, which are more conducive to the incorporation of In.

Another solution consists in reducing the strains in the active region of the LED structure by using a substrate or pseudo-substrate with a lattice parameter closer to the lattice parameter of the InGaN alloy of the quantum wells. Thus, even with a planar configuration, the degree of incorporation of In in InGaN can be increased. It has been shown that, when the lattice parameter of the substrate increases, the internal electrical field is reduced in comparison with a strained layer with the same In concentration and the emissions of the quantum wells are shifted towards red [1]. The relaxed InGaN layer obtained allows a III-N heterostructure to be obtained by metalorganic vapour-phase epitaxy (MOVPE). However, to our knowledge, the only substrate to date that has demonstrated this is the InGaNOS pseudo-substrate from Soitec obtained by the Smart Cut™ technique.

Another solution for reducing the overall strains in the GaN/InGaN LED structures consists in porosifying the GaN layer. In reference document [2], a stack comprising a sapphire substrate covered by a layer of unintentionally doped GaN (uid-GaN) and a layer of n+ doped GaN are firstly prepared. The layer of doped GaN acts as an anode and a platinum wire acts as a cathode. Electrochemical porosification is carried out in an oxalic acid solution (0.2 M) by applying a voltage of 15V for 30 minutes and then under ultraviolet radiation in a KOH solution (0.06 M) at 9V for 30 minutes. The porosified GaN layer thus obtained allows for the growth of an LED structure with multiple quantum wells (MQWs) composed of a layer of n+GaN, five GaN/InGaN quantum wells (QWs) and a p GaN contact layer. The significant relaxation of the strains leads to better electrical and optical properties, in particular with regard to photoluminescence (PL).

However, the crystalline quality of the GaN layer of the LED depends on the diameter of the pores and on the porosity of the porosified GaN layer, as well as on the desired thickness. The appropriate parameters must thus be determined in each instance, which complicates any industrialisation of this method.

A relaxed epitaxially grown InGaN layer was produced from a GaN/InGaN substrate and a relaxed epitaxially grown InGaN layer was produced on InGaN mesas using methods involving electrochemical porosification. Porosification is a full-wafer step carried out by means of various transfers [3, 4].

DISCLOSURE OF THE INVENTION

One purpose of the present invention is to propose a method that at least partially overcomes the drawbacks of the prior art, and in particular a method for obtaining a GaN/InGaN structure that is at least partially, or completely, relaxed, in order to produce a native emission matrix, and more particularly an RGB (Red Green Blue) matrix with red green blue pixels.

For this purpose, the present invention proposes a method for producing a native emission matrix comprising the following steps of:

a) providing a base structure comprising, successively, a substrate, a preferably unintentionally doped GaN layer, a doped In(x)GaN layer where x is from 0 to 8%, and an unintentionally doped In(x)GaN epitaxial regrowth layer, b) patterning mesas in the base structure, the mesas comprising a portion of the doped In(x)GaN layer and the unintentionally doped In(x)GaN epitaxial regrowth layer, whereby the mesas are electrically interconnected with one another via the doped In(x)GaN layer;

c) porosifying electrochemically the doped In(x)GaN layer;

d) creating, advantageously by epitaxial growth, a first LED structure on a first mesa, a second LED structure on a second mesa, and a third LED structure on a third mesa, whereby a first LED having a first emission wavelength, for example blue, and a second LED having a second emission wavelength, for example red, respectively, are obtained, and a native emission matrix is formed.

The invention fundamentally differs from the prior art through the use of a pseudo-substrate comprising porous mesas and through the implementation of at least two successive epitaxial growths to epitaxially grow at least two micro-LED structures separately.

The epitaxial regrowth layer will guide the level of relaxation of each of the mesas so as to obtain the ideal level of relaxation for each LED structure. The use of porous mesas is conducive to the incorporation of In for, in particular, obtaining an efficient red emission.

Moreover, the structure of each micro-LED is perfectly adapted to the target wavelength, which maximises the external quantum efficiency (EQE).

Advantageously, the GaN layer has a thickness of between 100 nm and 6 µm and/or the doped In(x)GaN layer has a thickness of between 100 nm and 1 µm, or even up to several micrometres, and/or the unintentionally doped In(x)GaN epitaxial regrowth layer has a thickness of between 10 nm and 200 nm. Several successive masking processes are implemented to carry out the epitaxial growths.

Advantageously, the first LED structure comprises a first $In(x_1)GaN$ layer in contact with the epitaxial regrowth layer of the first mesa, where $x_1$ is a value that is chosen such that the strain state of this layer is adapted to the first LED structure.

Advantageously, the second LED structure comprises a first $In(x_2)GaN$ layer in contact with the epitaxial regrowth layer of the second mesa, where $x_2$ is a value that is chosen such that the strain state of this layer is adapted to the second LED structure.

According to a particularly advantageous alternative embodiment, in step d), a third LED structure is produced on a third mesa, whereby a third LED having a third emission wavelength, for example green, is obtained and an RGB matrix is advantageously formed.

Advantageously, the third LED structure comprises a first $In(x_3)GaN$ layer in contact with the epitaxial regrowth layer of the third mesa, where $x_3$ is a value that is chosen such that the strain state of this layer is adapted to the third LED structure.

The term 'strain state of a layer adapted to the LED structure' is understood to mean that the quantity of indium is chosen depending on the desired wavelength so as to improve the quality of the material and manage to incorporate more indium into the wells.

Advantageously, $x_1$ has a value chosen in the range from 0 to 3%, and/or $x_2$ has a value chosen in the range from 5 to 8%, and/or $x_3$ has a value chosen in the range from 10 to 15%.

More advantageously:

the first LED structure comprises the first $In(x_1)GaN$ layer, where $x_1$ is a value chosen in the range from 0 to 3% (for example 3%), $In_{0.15}Ga_{0.85}N/In_{0.03}Ga_{0.97}N$ quantum wells and a doped p-type GaN layer, and/or the second LED structure comprises the first $In(x_2)GaN$ layer, where $x_2$ is a value chosen in the range from 5 to 8% (for example 8%), $In_{0.25}Ga_{0.75}N/In_{0.08}Ga_{0.92}N$ quantum wells and a doped p-type InGaN layer, and/or the third LED structure comprises the first $In(x_3)GaN$ layer, where $x_3$ is a value chosen in the range from 10 to 15% (for example 15%), $In_{0.40}Ga_{0.60}N/In_{0.15}Ga_{0.85}N$ quantum wells and a doped p-type InGaN layer.

Advantageously, the first layer of the first LED structure, and/or the first layer of the second LED structure and/or the first layer of the third LED structure has a thickness of between 50 and 200 nm.

RGB LEDs are advantageously formed by three successive masking and epitaxial growth processes.

Advantageously, step d) includes the following sub-steps of:

forming a first mask, for example an $SiO_2$ or SiN mask, on the second series of mesas and on the third series of mesas.

producing the first LED structure by epitaxial growth on the first series of mesas, thereby obtaining the first series of blue LEDs.

depositing a first dielectric layer, preferably made of SiN, with a thickness of 100 nm for example.

locally etching the first dielectric layer facing the second series of mesas to make it accessible.

producing the second LED structure by epitaxial growth on the second series of mesas, thereby forming the second series of green LEDs.

depositing a second dielectric layer, preferably made of SiN, with a thickness of 100 nm for example.

locally etching the second dielectric layer facing the third series of mesas to make it accessible.

producing the third LED structure by epitaxial growth on the third series of mesas, thereby forming the third series of red LEDs.

removing the mask, the first dielectric layer and the second dielectric layer.

Advantageously, the mesas have edges parallel to the m-planes of the epitaxially grown GaN. They are preferably hexagonal in shape. They can also be equilateral in shape. They can also have a flattened shape. More particularly, the longest diagonal is aligned parallel to the m-planes of the doped and intrinsic InGaN layers. For example, on a Sapphire substrate, the longest diagonal is aligned parallel to the flat of a 4" plate. Such a shape limits or even prevents overgrowths that could lead to short-circuits and/or delamination phenomena.

The method has numerous advantages:

it is simple to use, the mesa patterning combined with the porosification of the mesas provide the compliance effect, it leads to partial or total strain relaxation and reduces piezoelectric polarisation compared to a strained layer with the same In concentration, it allows for a so-called "bottom-up" approach to µLED and µdisplay production: the optical structures (N, QW, P) are grown after mesa pixelisation, regardless of the pixel size, and it thus prevents the alignment problems associated with the "pick and place" method; moreover, the pixel etching process has no impact on the efficiency of the micro-LEDs by the creation of non-radiative defects, making it possible to produce micro-metric pixels, the method does not require a transfer step for porosification, it results in RGB micro-LEDs epitaxially grown on the same substrate.

The invention further relates to a native emission matrix comprising:

a base structure comprising, successively, a substrate, a preferably unintentionally doped GaN layer, a doped In(x)GaN layer where x is from 0 to 8%, and an unintentionally doped In(x)GaN epitaxial regrowth layer, a first mesa and a second mesa formed in the base structure, the mesas comprising a portion of the doped In(x)GaN layer and the unintentionally doped In(x)GaN epitaxial regrowth layer, the doped In(x)GaN layer being porosified, the first mesa being covered with a first LED structure to form a first LED, having a first emission wavelength, for example blue, the second mesa being covered with a second LED structure to form a second series of LEDs, having a second emission wavelength, for example red.

Advantageously, the matrix comprises a third mesa covered with a third LED structure, having a third emission wavelength, for example green, so as to advantageously form an RGB matrix.

Advantageously, the first LED structure comprises a first $In(x_1)GaN$ layer in contact with the epitaxial regrowth layer of the first series of mesas, where $x_1$ is a value chosen in the range from 0 to 3%, and/or the second LED structure comprises a first $In(x_2)GaN$ layer in contact with the epitaxial regrowth layer of the second series of mesas, where $x_2$ is a value chosen in the range from 5 to 8%, and/or the third LED structure comprises a first $In(x_3)GaN$ layer in contact with the epitaxial regrowth layer of the third series of mesas, where $x_3$ is a value chosen in the range from 10 to 15%.

Advantageously, the first LED structure comprises the first $In(x_1)GaN$ layer, where $x_1$ is a value chosen in the range from 0 to 3%, for example 3%, $In_{0.15}Ga_{0.85}N/In_{0.03}Ga_{0.97}N$ quantum wells and a doped p-type GaN layer, and/or the second LED structure comprises the first $In(x_2)GaN$ layer, where $x_2$ is a value chosen in the range from 5 to 8%, for example 8%, $In_{0.25}Ga_{0.75}N/In_{0.08}Ga_{0.92}N$ quantum wells and a doped p-type InGaN layer, and/or the third LED structure comprises the first $In(x_3)GaN$ layer, where $x_3$ is a value chosen in the range from 10 to 15%, for example 15%, $In_{0.40}Ga_{0.60}N/In_{0.15}Ga_{0.85}N$ quantum wells and a doped p-type InGaN layer.

Advantageously, the first layer of the first LED structure, and/or the first layer of the second LED structure and/or the first layer of the third LED structure has a thickness of between 50 and 200 nm.

Other features and advantages of the invention will become apparent from the following additional description.

It goes without saying that this additional description is given only as an illustration of the subject matter of the invention and should in no way be interpreted as a limitation of this subject matter.

BRIEF DESCRIPTION OF THE DRAWINGS

The present invention will be better understood upon reading the description of example embodiments given merely for indication and without limitation with reference to the accompanying drawings in which.

The different portions shown in the figures are not necessarily given according to a uniform scale, in order to make the figures more readable.

The various possibilities (alternatives and embodiments) must be understood as not being mutually exclusive and can be combined with one another.

Furthermore, in the description hereinafter, terms that depend on the orientation, such as "top", "bottom", etc., of a structure apply while considering that the structure is oriented as illustrated in the figures.

DETAILED DESCRIPTION OF PARTICULAR EMBODIMENTS

Although by no means limitative, the invention has particular applications in the simplified production of a multi-spectral device, for example LEDs of different colours, or a multi-colour micro-display.

In the description hereinbelow, the method for producing a native emission matrix of the RGB type (i.e. with three different emission wavelengths) will be in particular described, however the method can be applied to any matrix with at least two different emission wavelengths.

Figure 1A:
FIG. 1A to 1Q diagrammatically show a sectional view of various steps of a method for producing an RGB matrix according to a particular embodiment of the invention.
Figure 1B:
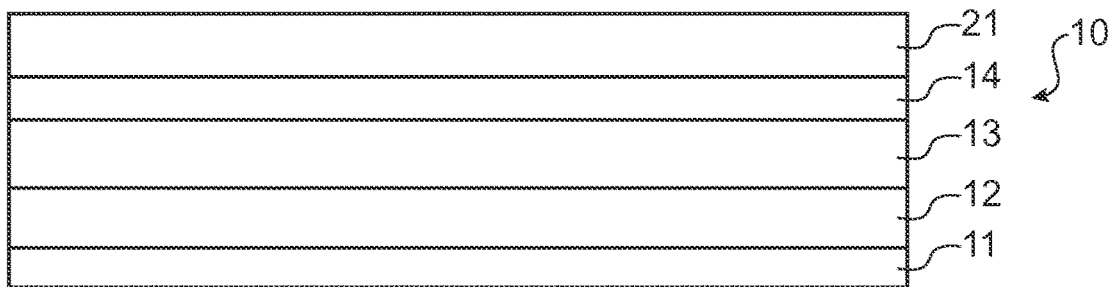
Figure 1C:
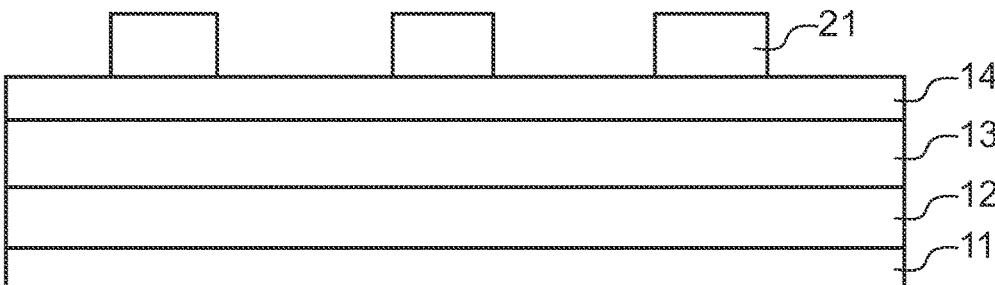
Figure 1D:
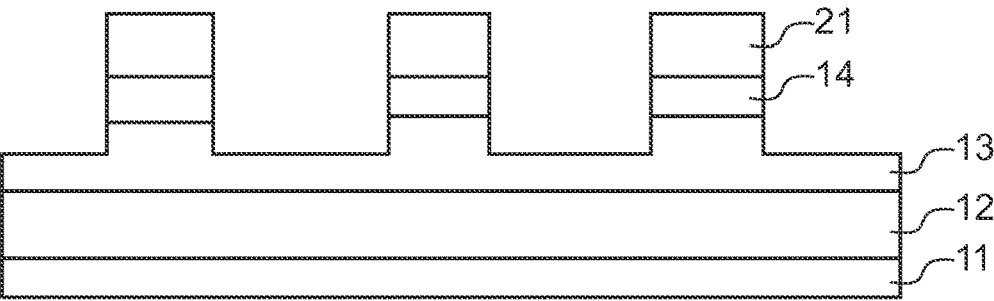
Figure 1E:
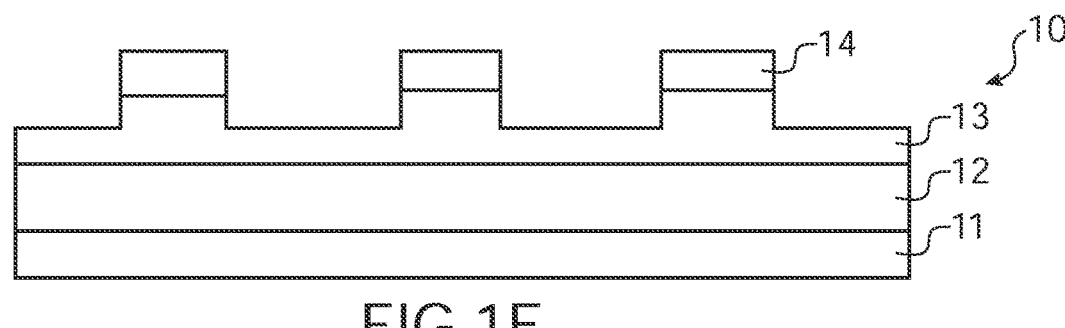
Figure 1F:
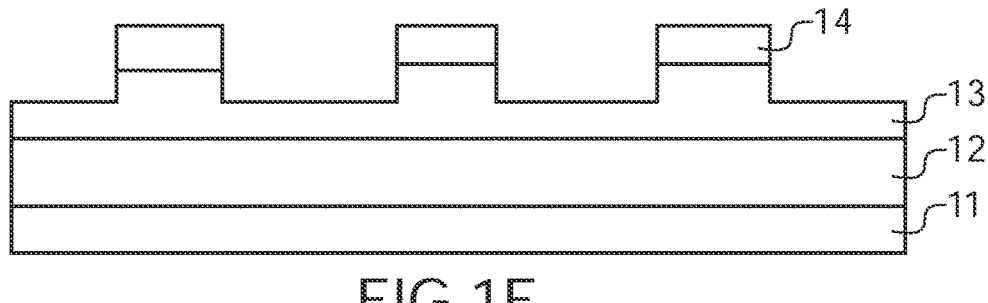
Figure 1G:
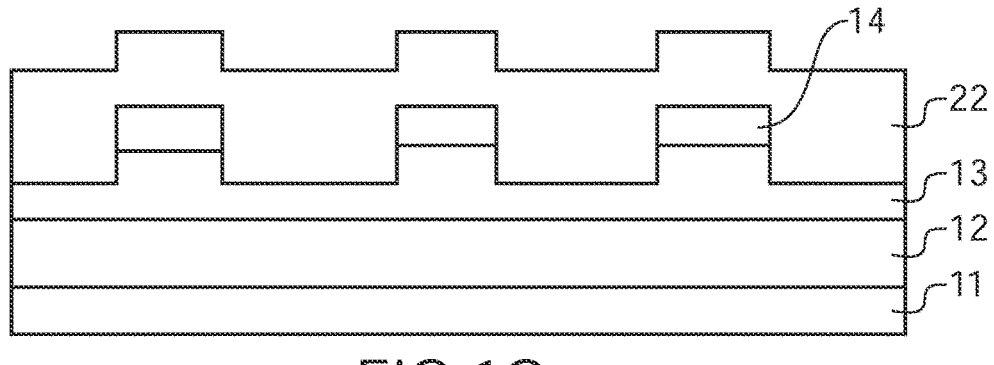
Figure 1H:
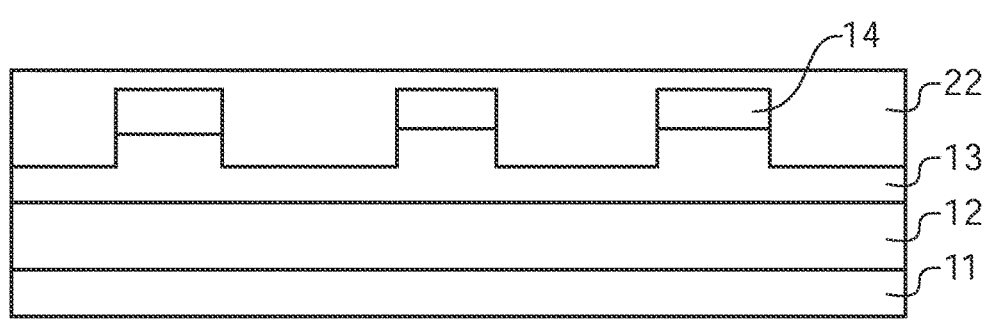
Figure 1I:
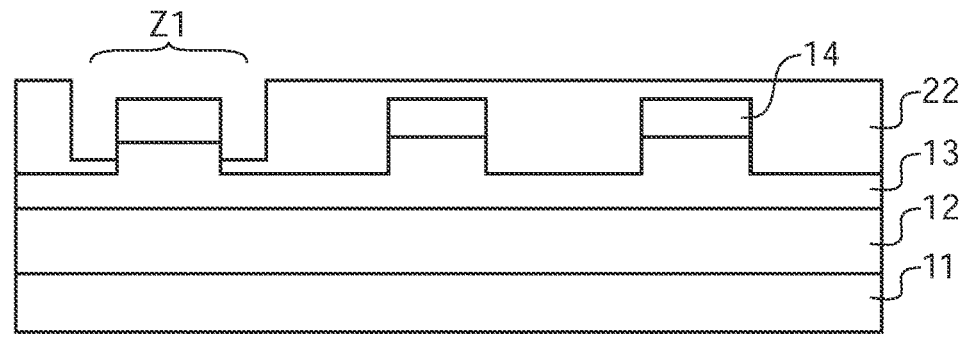
Figure 1J:
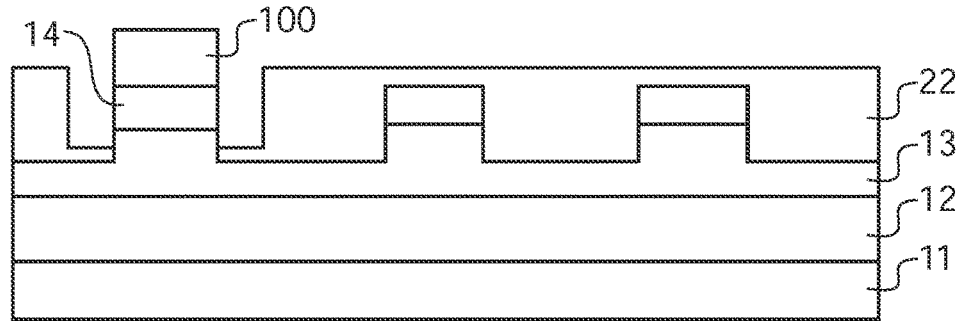
Figure 1K:
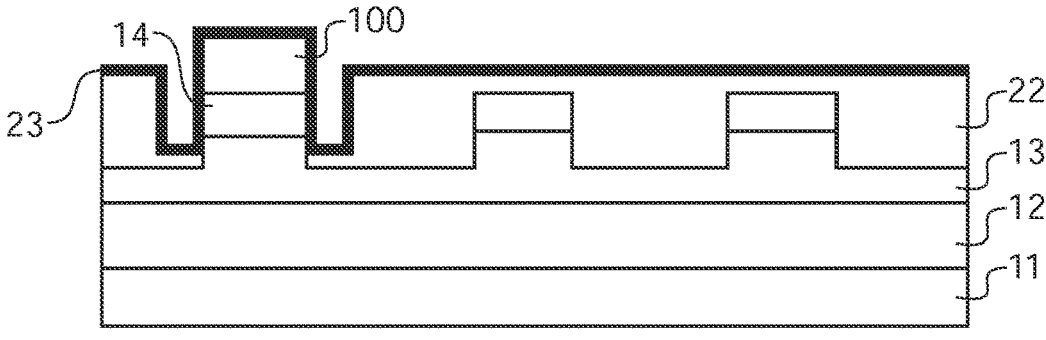
Figure 1L:
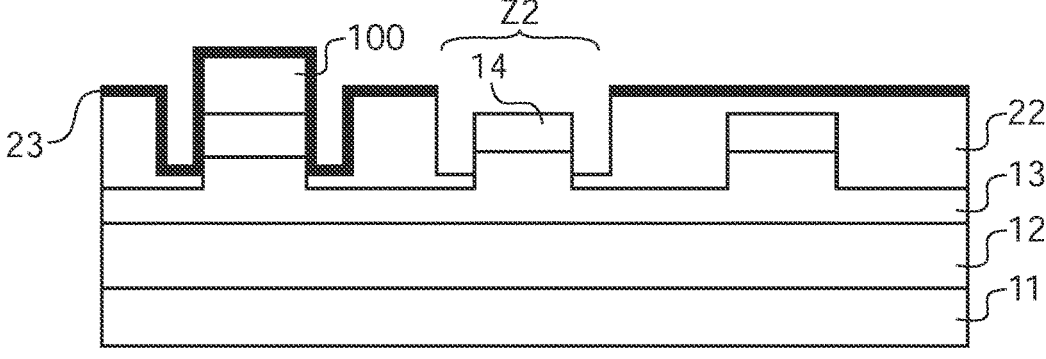
Figures 1M, 1N, 1O, 1P, 1Q:
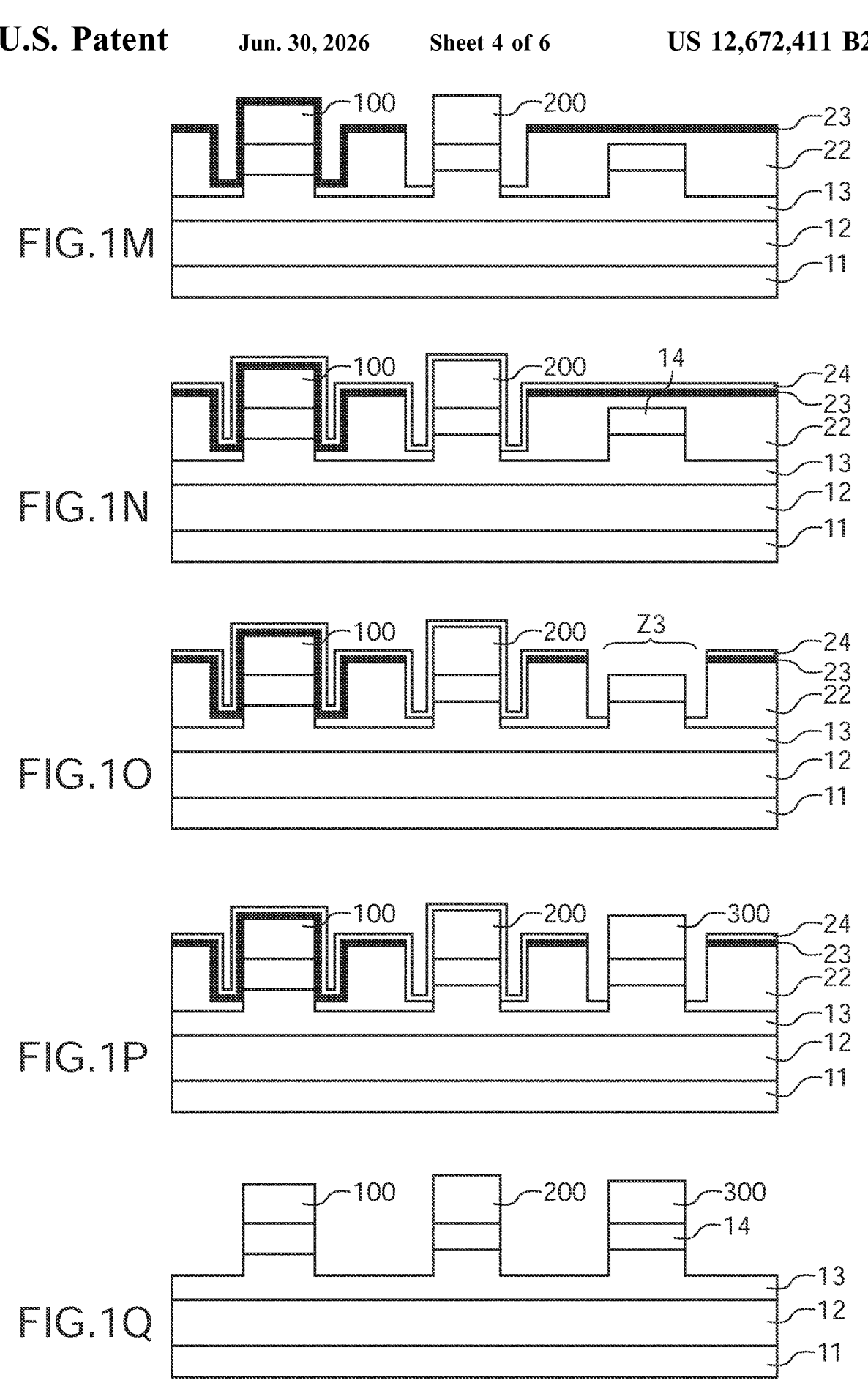

With reference to FIG. 1A to 1Q, a method for producing an RGB matrix according to a particular embodiment will now be described. This method implements the following steps of:

a) providing a base structure 10 comprising, successively, a substrate 11, a preferably unintentionally doped GaN layer 12, a doped In(x)GaN layer 13 where x is from 0 to 8%, and an unintentionally doped In(x)GaN epitaxial regrowth layer 14 (FIG. 1A), advantageously, depositing a mask (FIG. 1B), then locally etching it (FIG. 1C), b) patterning mesas in the base structure 10, the mesas comprising a portion of the doped In(x)GaN layer 13 and the unintentionally doped In(x)GaN epitaxial regrowth layer 14, whereby the mesas are electrically interconnected with one another via the doped In(x)GaN layer 13 (FIG. 1D), then, where relevant, removing the mask (FIG. 1E), c) porosifying electrochemically the doped In(x)GaN layer 13 (FIG. 1F), d) producing a first LED structure 100 on a first series of mesas, a second LED structure 200 on a second series of mesas, and a third LED structure 300 on a third series of mesas, whereby a first series of blue LEDs, a second series of red LEDs, and a third series of green LEDs are respectively obtained, and an RGB matrix is formed (FIG. 1G-1Q).

Advantageously, the LED structures are formed on series of mesas to obtain series of LEDs of different colours, however the method can be carried out to form each LED structure on a single mesa.

The base structure 10 comprises, and preferably consists of (FIG. 1A):

a substrate 11, a layer of preferably unintentionally doped GaN 12, a doped In(x)GaN layer 13, where x is a value chosen in the range from 0 to 8%, an unintentionally doped In(x)GaN epitaxial regrowth layer 14, where x is a value chosen in the range from 0 to 8%.

The substrate 11 is, for example, made of sapphire or silicon. It is between 250 μm and 1500 μm thick for example.

The GaN layer 12 is preferably an unintentionally doped (uid) layer so that it is not porosified. It is between 100 nm and 6 am thick for example. The layer 12 can be up to 4 μm thick for conventional GaN on sapphire, and up to 6 μm thick on patterned sapphire (PSS) for example.

The doped In(x)GaN layer 13 has an In x content of between 0% and 8%. It can thus be a layer of GaN or a layer of InGaN. It is, for example, N-type doped between $1 \cdot 10^{18}/cm^3$ and $2 \cdot 10^{19}/cm^3$, for example from $3 \cdot 10^{18}$ cm$^{-3}$ to $1.5 \cdot 10^{19}$ cm$^{-3}$, preferably from $6 \cdot 10^{18}$ cm$^{-3}$ to $1.5 \cdot 10^{19}$ cm$^{-3}$. The In(x)GaN layer can be doped, for example, by epitaxial growth or by silicon (Si(n)) or magnesium (Mg(p)) implantation. This doped layer is electrically conductive and can be porosified in step c). It is preferably between 100 nm and 1 μm thick, for example between 800 nm and 1 μm thick.

The In(x)GaN epitaxial regrowth layer 14 is unintentionally doped. It has an In x content of between 0% and 8%. It can thus be a layer of GaN or a layer of InGaN. It is, for example, between 10 nm and 200 nm thick, preferably between 50 and 200 nm thick. This undoped layer is electrically insulated and is not porosified in step c).

In step b), mesas are patterned in the base structure 10.

Mesas, also referred to as elevations, are raised elements. They are obtained, for example, by etching a continuous layer or a plurality of stacked continuous layers, so as to leave only a certain number of "raised portions" of this or these layers. Etching is typically a plasma etching (or dry etching) process. Mesas can be formed in the base structure, for example, by photolithography (FIG. 1B-1D). A mask 21 made of SiO$_2$ is advantageously used. Raised portions can be used to define pixels.

Controlled mesa etching allows etching to be stopped in the doped In(x)GaN layer. In other words, the doped In(x)GaN layer is partially etched to ensure electrical conduction during electrochemical porosification.

Preferably, the sidewalls of the mesas are perpendicular to this stack of layers.

The mesas can be square in shape. The dimensions (width and length) of the mesas range, for example, from 500 nm to 500 μm.

Advantageously, they can be hexagonal in shape, with, for example, a largest dimension of between 500 nm and 500 μm. The use of hexagonal mesas leads to the formation of a hexagonal LED structure.

The pitch between two consecutive mesas ranges, for example, from 50 nm to 20 am.

In step c), the doped layer 13 is selectively porosified (FIG. 1F). This takes place throughout the doped layer 13: in the portion of the layer that forms part of the mesas and in the portion of the layer that is in contact with the underlying GaN layer 12.

This step can be carried out in accordance with the following sub-steps of:

electrically connecting the electrically conductive doped In(x)GaN layer 13 of the base structure 10 and an auxiliary electrode to a voltage or current generator, immersing the base structure 10 and the auxiliary electrode in an electrolyte solution, applying a voltage or a current between the electrically conductive doped GaN layer and the second electrode to porosify the doped In(x)GaN layer 13.

During the anodising step, the doped layer 13, which is continuous and common to all mesas, acts as the work electrode (WE). Hereinafter, it will be referred to as a voltage generator, but it could also be a current generator that allows a current to be applied between the device and the auxiliary electrode.

The auxiliary electrode is made of an electrically conductive material, for example a metal such as platinum.

The electrodes are immersed in an electrolyte, also referred to as an electrolyte bath or electrolyte solution. The electrolyte can be acidic or basic. The electrolyte is oxalic acid for example. It can in particular be KOH, HF, HNO$_3$, NaNO$_3$ or H$_2$SO$_4$.

The voltage applied between the device and the auxiliary electrode can range from 1 to 100 V. It is applied, for example, for a period from a few seconds to several hours. Porosification is complete when there is no longer any current of the imposed potential. At this point, the entire doped structure has been porosified and the electrochemical reaction stops.

Advantageously, porosification takes place throughout the volume of the doped In(x)GaN layer 13.

At the end of the porosification step, the porosity of the doped In(x)GaN layer 13 can be between 0 and 70%, preferably at least 10% (for example from 10% to 50%). It is preferably from 25% to 50%. For example, a degree of porosification of 25% can be achieved for a $6 \cdot 10^{18}/cm^3$ n-type doped 2D GaN layer.

The largest dimension (height) of the pores can vary from a few nanometres to a few micrometres. The smallest dimension (diameter) can vary from a few nanometres to a hundred nanometres, in particular from 30 to 70 nm.

The porosification obtained (porosity rate and pore size) depends on the doping of the doped In(x)GaN layer 13 of the mesas and on process parameters (applied voltage, duration, nature and concentration of the electrolyte, chemical aftertreatment or annealing). Variation in porosification enables the incorporation/segregation rate to be controlled. Porosification, and in particular pore size, can be varied at a later stage, during epitaxial regrowth, depending on the temperature applied.

The result of step c) is a pseudo-substrate comprising porosified mesas comprising a porosified layer 13 and a relaxed, dense epitaxial regrowth layer 14 (FIG. 1F).

In step d), LED structures 100, 200, 300 are epitaxially regrown on the epitaxial regrowth layers 14 of the mesas to form the red-green-blue pixel matrix. Re-growth takes place vertically above the mesas: the pixels correspond to the underlying mesas. The pixel matrix consists of a first series of mesas for the colour blue, a second series of mesas for the colour green, and a third series of mesas for the colour red. Three epitaxial growths are carried out to form the three LED colours.

Advantageously, the following steps are carried out for the first LED structure 100: depositing a mask, patterning the mask by etching to open the mask locally, depositing the first LED structure 100.

Advantageously, in order to produce the second LED structure 200 and/or the third LED structure 300, a dielectric layer ('liner') is deposited, which is locally opened so that the LED structure can be deposited. The term 'liner' is understood to mean a layer with enhanced conformity, also allowing the vertical sidewalls and the inside and outside corners (mesa corners) to be covered.

By way of illustration, step d) includes the following sub-steps of:

forming a first mask 22, for example a $SiO_2$ or SiN mask, on the mesas (FIG. 1G), optionally planarising the surface of the mask 21 (FIG. 1H), locally etching the mask at a first region Z1 covering a first series of mesas (FIG. 1I)

epitaxially growing a first LED structure 100 on the first series of mesas, thereby obtaining a first series of blue LEDs (FIG. 1J), depositing, by full-wafer deposition, a first dielectric layer 23 (liner), preferably made of SiN, with a thickness of 100 nm for example (FIG. 1K), locally etching the first dielectric layer 23 at a second region Z2 facing the second series of mesas to make it accessible (FIG. 1L), epitaxially growing a second LED structure 200 on the second series of mesas, thereby forming a second series of green LEDs (FIG. 1M), depositing, by full-wafer deposition, a second dielectric layer 24 (liner), preferably made of SiN, with a thickness of 100 nm for example (FIG. 1N), locally etching the second dielectric layer 24 at a third region Z3 facing the third series of mesas to make it accessible (FIG. 1O), epitaxially growing a third LED structure 300 on the third series of mesas, thereby forming a third series of red LEDs (FIG. 1P), removing the mask 22, the first dielectric layer 23 and the second dielectric layer 24 (FIG. 1Q); for example, in order to remove the mask 21, a wet process would be implemented, with a hydrofluoric acid (HF) solution for an $SiO_2$ mask.

Figures 2A, 2B, 3, 4:
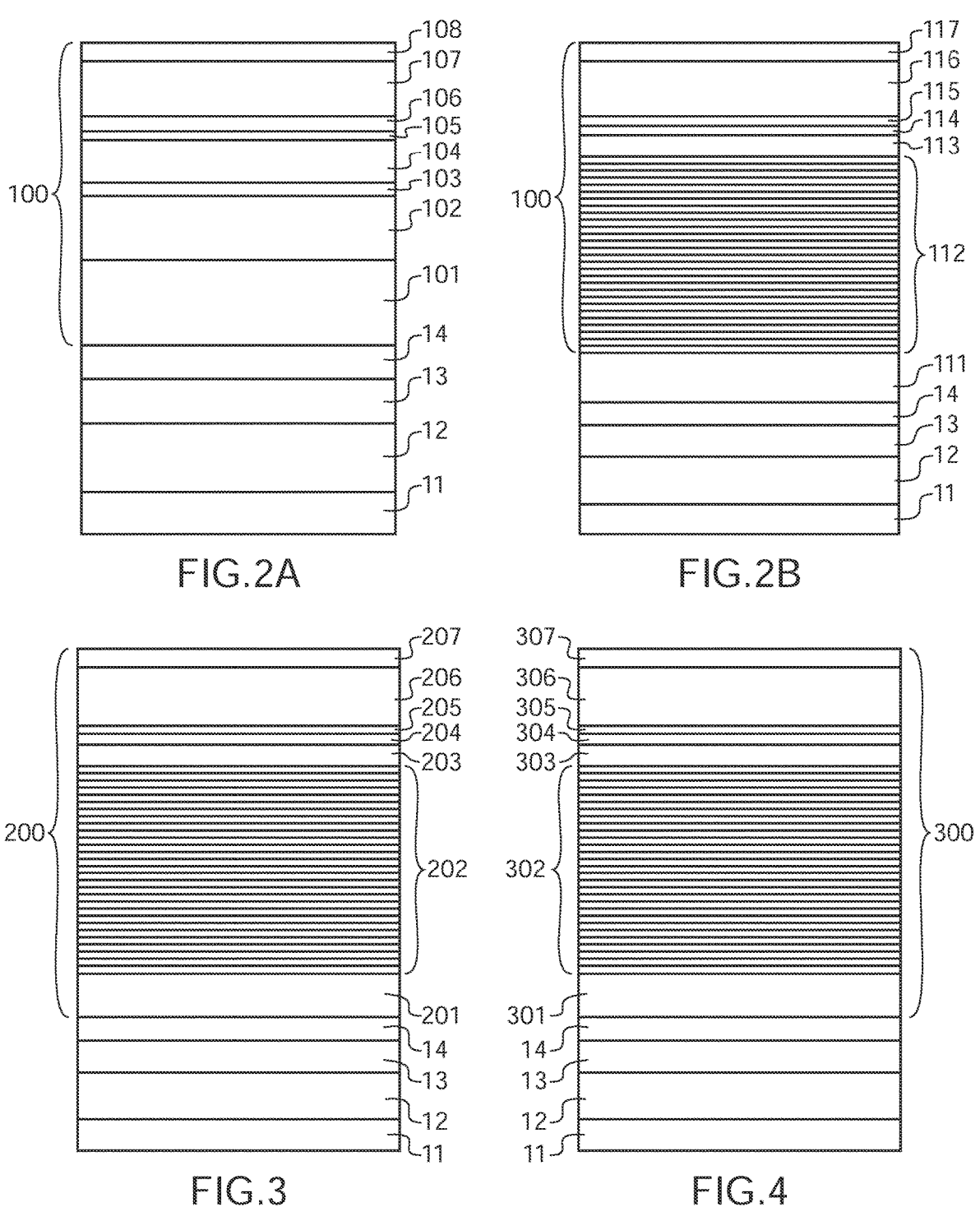
FIGS. 2A and 2B diagrammatically show a sectional view of various blue LED structures according to various particular embodiments of the invention.
FIG. 3 diagrammatically shows a sectional view of a green LED structure according to a particular embodiment of the invention.
FIG. 4 diagrammatically shows a sectional view of a red LED structure according to a particular embodiment of the invention.

Different LED structures 100 can be chosen in order to obtain blue LEDs (FIGS. 2A and 2B).

For a GaN-type base structure 10 (i.e. where x is equal to 0), an epitaxially regrown stack for example can be chosen, which stack successively comprises, from the epitaxial regrowth layer (FIG. 2A):

a GaN:Si layer 101 having, for example, a thickness of less than 1 μm, an InGaN/GaN layer 102 formed by $20 \times In_{0.15}GaN/GaN_{0.85}$ (thicknesses of 2.8 nm/10 nm), or an $In_{0.05}Ga_{0.95}N$ layer with, for example, a thickness of 50 nm, an unintentionally doped GaN spacer layer 103 with a thickness of 30 nm for example, an active region 104 formed by multiple quantum wells (MQWs), formed by $5 \times In_{0.15}Ga_{0.085}N/GaN$ (thicknesses of 2.5 nm/10 nm), an unintentionally doped GaN spacer layer 105 with a thickness of 10 nm for example, a doped p-type $Al_{0.15}Ga_{0.85}N$ layer 106 with a thickness of 15 nm, a doped p-type GaN layer 107 (125 nm), a doped p+++type GaN layer 108 (20 nm).

Such a structure 100 is simple to epitaxially grow.

For an InGaN-type base structure 10 or if the unintentionally doped epitaxial regrowth layer 14 of the mesas is made of InGaN (i.e. where x is not 0), an epitaxially regrown stack can be chosen, which stack successively comprises, from the epitaxial regrowth layer (FIG. 2B):

an $In(x_1)GaN$ layer 111, where $x_1$ is from 0 to 3%, for example 3%, having, for example, a thickness of 50 to 200 nm, an n-type doped InGaN layer 112 consisting of $15 \times In_{0.03}Ga_{0.97}N/GaN$ (thicknesses of 22 nm/1.8 nm) or consisting of a single n-type doped $In_{0.03}Ga_{0.97}N$ buffer layer having a thickness of 400 to 500 nm for example, an active region 113 formed by multiple quantum wells (MQWs), formed by $5 \times In_{0.15}Ga_{0.85}N/In_{0.03}Ga_{0.97}N$ (thicknesses of 2.5 nm/6 nm), an unintentionally doped GaN spacer layer 114 with a thickness of 10 nm for example, a doped p-type $Al_{0.15}Ga_{0.85}N$ layer 115 with a thickness of 15 nm, a GaN:Mg layer 116 (125 nm), a doped p+++type GaN layer 117 (25 nm), Such a structure is stable, and in particular, when the structure is in line with the lattice parameter of the InGaN substrate (where x=3%), no new defects are formed. A structure containing predominantly GaN is easy to control during epitaxial growth.

For the second epitaxial regrowth forming the second series of (green) LEDs, an all-InGaN LED structure 200 adapted for epitaxial growth on relaxed InGaN is chosen. The epitaxially regrown stack comprises, for example, from the epitaxial regrowth layer (FIG. 3):

an $In(x_2)GaN$ layer 201, where $x_2$ ranges from 5 to 8%, for example 8%, having, for example, a thickness of 50 to 200 nm, an n-type doped InGaN layer 202 consisting of $15 \times In_{0.08}Ga_{0.92}N/GaN$ (thicknesses of 22 nm/1.8 nm) or consisting of a single n-type doped $In_{0.08}Ga_{0.92}N$ buffer layer having a thickness of 400 to 500 nm for example, an active region 203 formed by multiple quantum wells (MQWs), formed by $5 \times In_{0.25}Ga_{0.75}N/In_{0.08}Ga_{0.92}N$ (thicknesses of 2.5 nm/6 nm), an unintentionally doped $In_{0.08}Ga_{0.92}N$ spacer layer 204 with a thickness of 10 nm for example, an $Al_{0.05}Ga_{0.95}N$:Mg layer 205 with a thickness of 15 nm, an $In_{0.08}Ga_{0.92}N$:Mg layer 206 (125 nm), a doped p+++type $In_{0.08}Ga_{0.92}N$ layer 207 (25 nm).

For the third epitaxial regrowth forming the third series of red LEDs, an all-InGaN LED structure adapted for epitaxial growth on relaxed InGaN is chosen. The epitaxially regrown stack comprises, for example, from the epitaxial regrowth layer (FIG. 4):

an $In(x_3)GaN$ layer 301, where $x_3$ ranges from 10 to 15%, for example 15%, having, for example, a thickness of 50 to 200 nm, an n-type doped InGaN layer 302 consisting of $15\times In_{0.15}Ga_{0.85}N/GaN$ (thicknesses of 22 nm/1.8 nm) or consisting of a single n-type doped $In_{0.15}Ga_{0.85}N$ buffer layer having a thickness of 400 to 500 nm for example, an active region 303 formed by multiple quantum wells (MQWs), formed by $5\times In_{0.40}Ga_{0.60}N/In_{0.15}Ga_{0.85}N$ (thicknesses of 2.5 nm/6 nm), an unintentionally doped $In_{0.15}Ga_{0.85}N$ spacer layer 304 with a thickness of 10 nm for example, a GaN:Mg layer 305 with a thickness of 15 nm, an $In_{0.15}Ga_{0.85}N$:Mg layer 306 (125 nm), a doped p+++type $In_{0.15}Ga_{0.85}N$ layer 307 (25 nm).

The method results in a native emission matrix emitting at at least two different wavelengths.

A native emission matrix emitting at at least three different wavelengths (preferably an RGB matrix) is described in greater detail below. The matrix comprises:

a base structure 10 comprising, successively, a substrate 11, a GaN layer 12, a doped $In(x)GaN$ layer 13 where x ranges from 0 to 8%, and an unintentionally doped $In(x)GaN$ epitaxial regrowth layer 14, a first series of mesas, a second series of mesas and a third series of mesas formed in the base structure 10, the mesas comprising a portion of the doped $In(x)GaN$ layer 13 and the unintentionally doped $In(x)GaN$ epitaxial regrowth layer 14, the doped $In(x)GaN$ layer 13 being porosified, the first series of mesas being covered with a first LED structure 100 to form a first series of blue LEDs, the second series of mesas being covered with a second LED structure 200 to form a second series of red LEDs, and the third series of mesas being covered with a third LED structure 300 to form a third series of green LEDs.

Figure 5:
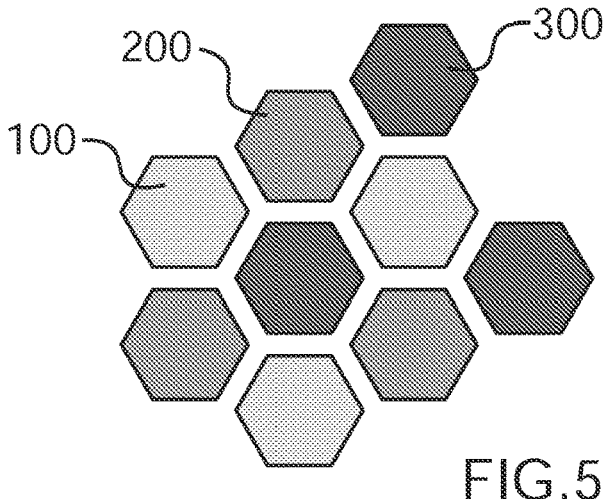
FIG. 5 diagrammatically shows a top view of an RGB matrix comprising hexagonal pixels according to a particular embodiment of the invention.

Advantageously, the LED structures 100, 200, 300 of the RGB pixels of the matrix are hexagonal (FIG. 5 for an equilateral hexagon). The hexagons can have sides of the same length or of different lengths ('flattened' hexagons). Such patterns allow InGaN or GaN growth rates in both the a-plane and the m-plane to be taken into account.

Figure 6:
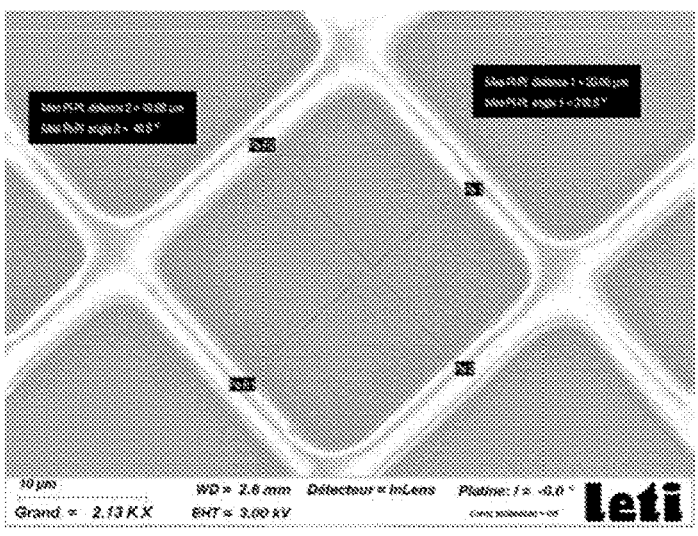
FIG. 6 is an image obtained under a scanning electron microscope of square GaN mesas with sides of 20 µm.

FIG. 6 shows a mesa with sides of 20 μm.

Figure 7:
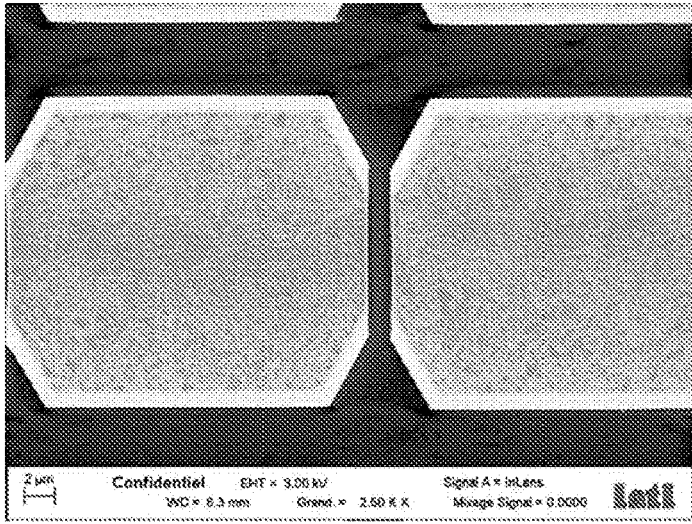
FIG. 7 is an image obtained under a scanning electron microscope of a 2 µm-thick GaN layer epitaxially grown on the mesas in FIG. 6 and showing the de-symmetrisation of the pattern which changes from a square pattern to a hexagonal-type pattern.

A 2 μm-thick layer of GaN was epitaxially grown on these mesas (FIG. 7).

Illustrative and Non-Limiting Examples of One Embodiment

This example uses a base structure 10 comprising:

a sapphire support 11, a layer 12 of unintentionally doped (uid) GaN, a layer 13 of doped n-type $In(x)GaN$ (for example at a doping concentration of $6\cdot10^{18}/cm^3$), where x is between 0 and 5%, with a thickness of 800 nm to 1 μm, a layer 14 of uid-$In(x)GaN$, where x is between 0 and 5%, with a thickness of 50 to 200 nm.

To produce the mesas, a mask 21, for example a hard mask made of $SiO_2$, is deposited on this base structure 10, and the mesas are then patterned using conventional photolithography techniques. The dimensions of the mesas obtained range from 500 nm to 10 μm. Controlled etching allows etching to be stopped in the doped $In(x)GaN$ layer. Chloride etching, for example, is used. The mask 21 is then removed.

This results in a base structure 10 with mesas.

Porosification is then carried out by electrochemical anodisation of the $In(x)GaN$ mesas in an electrolyte solution comprising 0.1 mol/L to 0.5 mol/L oxalic acid, for example 0.2 mol/L. The applied voltage is 24V. The degree of porosification obtained is, for example, 30 to 40%.

This can then be followed by annealing, for example at 900° C.

The three LED structures 100, 200, 300 are formed by carrying out the following steps of:

depositing, by full-wafer deposition, a mask 22, for example made of $SiO_2$ or SiN, to fill the space between the mesas, optionally, etching or chemical-mechanical polishing (CMP) to obtain a mask 22 with a planar surface (planarisation), etching the mask 22 facing a first region Z1 (corresponding to the first series of mesas), forming the first blue LED structure 100 by depositing: an $In(x_1)GaN$ layer 111, where $x_1$=3%, with a thickness of 50 to 200 nm for example, a doped n-type InGaN layer 112 consisting of $15\times In_{0.03}Ga_{0.97}N/GaN$ (thicknesses of 22 nm/1.8 nm) or consisting of a single doped n-type $In_{0.03}Ga_{0.97}N$ buffer layer with a thickness of 400 to 500 nm for example, an active region 113 consisting of multiple quantum wells (MQWs), consisting of $5\times In_{0.15}Ga_{0.85}N/In_{0.03}Ga_{0.97}N$ (thicknesses of 2.5 nm/6 nm), an unintentionally doped GaN spacer layer 114 with a thickness of 10 nm for example, a doped p-type $Al_{0.15}Ga_{0.85}N$ layer 115 with a thickness of 15 nm, a GaN:Mg layer 116 (125 nm), and a doped p+++type GaN layer 117 (25 nm), depositing a dielectric layer 23 ('liner'), for example a 100 nm SiN layer, etching the mask 22 and the dielectric layer 23 facing a second region Z2 (corresponding to the second series of mesas), forming the second green LED structure 200 by depositing: an $In(x_2)GaN$ layer 201, where $x_2$=8%, with a thickness of 50 to 200 nm for example, a doped n-type InGaN layer 202 consisting of $15\times In_{0.08}Ga_{0.92}N/GaN$ (thicknesses of 22 nm/1.8 nm) or consisting of a single doped n-type $In_{0.08}Ga_{0.92}N$ buffer layer with a thickness of 400 to 500 nm for example, an active region 203 consisting of multiple quantum wells (MQWs), consisting of $5\times In_{0.25}Ga_{0.75}N/In_{0.08}Ga_{0.92}N$ (thicknesses of 2.5 nm/6 nm), an unintentionally doped $In_{0.08}Ga_{0.92}N$ spacer layer 204 with a thickness of 10 nm for example, an $Al_{0.05}Ga_{0.95}N$:Mg layer 205 with a thickness of 15 nm, an $In_{0.08}Ga_{0.92}N$:Mg layer 206 (125 nm), and a doped p+++type $In_{0.08}Ga_{0.92}N$ layer 207 (25 nm), depositing a second dielectric layer 24 ('liner'), for example a 100 nm SiN layer, etching the mask 22 and the dielectric layers 23, 24 facing a third region Z3 (corresponding to the third series of mesas), forming the third red LED structure 300 by depositing: an $In(x_3)GaN$ layer 301, where $x_3$=15%, with a thickness of 50 to 200 nm for example, a doped n-type InGaN layer 302 consisting of $15\times In_{0.15}Ga_{0.85}N/GaN$ (thicknesses of 22 nm/1.8 nm) or consisting of a single doped n-type $In_{0.15}Ga_{0.85}N$ buffer layer with a thickness of 400 to 500 nm for example, an active region 303 consisting of multiple quantum wells (MQWs), consisting of $5 \times In_{0.40}Ga_{0.60}N/In_{0.15}Ga_{0.85}N$ (thicknesses of 2.5 nm/6 nm), an unintentionally doped $In_{0.15}Ga_{0.85}N$ spacer layer 304 with a thickness of 10 nm for example, a GaN:Mg layer 305 with a thickness of 15 nm, an $In_{0.15}Ga_{0.85}N$:Mg layer 306 (125 nm), and a doped p+++type $In_{0.15}Ga_{0.85}N$ layer 307 (25 nm), removing the mask 22 and the dielectric layers 23, 24, for example using a HF solution.

REFERENCES

[1] Even et al., "Enhanced In incorporation in full InGaN heterostructure grown on relaxed InGaN pseudo-substrate", Appl. Phys. Lett. 110, 262103 (2017).

[2] Jang et al., "Electrical and structural properties of GaN films and GaN/InGaN light-emitting diodes grown on porous GaN templates fabricated by combined electrochemical and photoelectrochemical etching", Journal of Alloys and Compounds 589 (2014) 507-512.

[3] EP 3 840 065 A1.

[4] EP 3 840 016 A1.

What is claimed is:

1. A method for producing a native emission matrix comprising the following steps of:

a) providing a base structure comprising, successively, a substrate, a preferably unintentionally doped GaN layer, a doped In(x)GaN layer where x is from 0 to 8%, and an unintentionally doped In(x)GaN epitaxial regrowth layer b) patterning mesas in the base structure, the mesas comprising a portion of the doped In(x)GaN layer and the unintentionally doped In(x)GaN epitaxial regrowth layer, whereby the mesas are electrically interconnected with one another;

c) porosifying electrochemically the doped In(x)GaN layer;

d) carrying out at least two successive epitaxial growths to epitaxially grow a first LED structure on a first mesa and a second LED structure on a second mesa, separately, whereby a first LED having a first emission wavelength, for example blue, and a second LED having a second emission wavelength, for example red, respectively, are obtained, and a native emission matrix is formed, the first LED structure comprising a first $In(x_1)GaN$ layer in contact with the epitaxial regrowth layer of the first mesa, where $x_1$ is a value that is chosen such that the strain state of the first $In(x_1)GaN$ layer is adapted to the first LED structure, the second LED structure comprising a first $In(x_2)GaN$ layer in contact with the epitaxial regrowth layer of the second mesa, where $x_2$ is a value that is chosen such that the strain state of the first $In(x_2)GaN$ layer is adapted to the second LED structure.

2. The method according to claim 1, wherein in step d), a third LED structure is produced on a third mesa, whereby a third LED having a third emission wavelength, for example green, is obtained and an RGB matrix is advantageously formed.

3. The method according to claim 2, wherein the third LED structure comprises a first $In(x_3)GaN$ layer in contact with the epitaxial regrowth layer of the third mesa, where $x_3$ is a value that is chosen such that the strain state of the first $In(x_3)GaN$ layer is adapted to the third LED structure.

4. The method according to claim 3, wherein:

$x_1$ has a value chosen in the range 0 to 3%, and/or $x_2$ has a value chosen in the range 5 to 8%, and/or $x_3$ has a value chosen in the range 10 to 15%.

5. The method according to claim 4, wherein:

$x_1$ has a value chosen in the range 0 to 3%, and $x_2$ has a value chosen in the range 5 to 8%, and $x_3$ has a value chosen in the range 10 to 15%.

6. The method according to claim 3, wherein:

the first LED structure comprises the first $In(x_1)GaN$ layer, where $x_1$ is a value chosen in the range from 0 to 3%, $In_{0.15}Ga_{0.85}N/In_{0.03}Ga_{0.97}N$ quantum wells and a doped p-type GaN layer, and/or the second LED structure comprises the first $In(x_2)GaN$ layer, where $x_2$ is a value chosen in the range from 5 to 8%, $In_{0.25}Ga_{0.75}N/In_{0.08}Ga_{0.92}N$ quantum wells and a doped p-type InGaN layer, and/or the third LED structure comprises the first $In(x_3)GaN$ layer, where $x_3$ is a value chosen in the range from 10 to 15%, $In_{0.40}Ga_{0.60}N/In_{0.15}Ga_{0.85}N$ quantum wells and a doped p-type InGaN layer.

7. The method according to claim 2, wherein the first layer of the first LED structure, and/or the first layer of the second LED structure and/or the first layer of the third LED structure has a thickness of between 50 and 200 nm.

8. The method according to claim 2, wherein step d) includes the following sub-steps of:

forming a first mask, for example an $SiO_2$ or SiN mask, on the second mesa and on the third mesa, producing the first LED structure by epitaxial growth on the first mesa, thereby obtaining the first LED, depositing a first dielectric layer, preferably made of SiN, with a thickness of 100 nm for example, locally etching the first dielectric layer facing the second mesa to make it accessible, producing the second LED structure by epitaxial growth on the second mesa, thereby forming the second LED, depositing a second dielectric layer, preferably made of SiN, with a thickness of 100 nm for example, locally etching the second dielectric layer facing the third mesa to make it accessible, producing the third LED structure by epitaxial growth on the third mesa, thereby forming the third LED, removing the mask, the first dielectric layer and the second dielectric layer.

9. The method according to claim 1, wherein the GaN layer has a thickness of between 100 nm and 6 μm and/or the doped In(x)GaN layer has a thickness of between 100 nm and 1 μm, and/or the unintentionally doped In(x)GaN epitaxial regrowth layer has a thickness of between 10 nm and 200 nm.

10. The method according to claim 1, wherein the mesas are hexagonal or equilateral in shape.

11. A native emission matrix comprising:

a base structure comprising, successively, a substrate, a preferably unintentionally doped GaN layer, a doped In(x)GaN layer where x is from 0 to 8%, and an unintentionally doped In(x)GaN epitaxial regrowth layer, a first mesa and a second mesa formed in the base structure, the mesas comprising a portion of the doped In(x)GaN layer and the unintentionally doped In(x) GaN epitaxial regrowth layer, whereby the mesas are electrically interconnected with one another, the doped In(x)GaN layer being porosified, the first mesa being covered with a first LED structure to form a first LED, having a first emission wavelength, for example blue, the second mesa being covered with a second LED structure to form a second series of LEDs, having a second emission wavelength, for example red, the first LED structure comprising a first $In(x_1)GaN$ layer in contact with the epitaxial regrowth layer of the first mesa, where $x_1$ is a value that is chosen such that the strain state of the first $In(x_1)GaN$ layer is adapted to the first LED structure, the second LED structure comprising a first $In(x_2)GaN$ layer in contact with the epitaxial regrowth layer of the second mesa, where $x_2$ is a value that is chosen such that the strain state of the first $In(x_2)GaN$ layer is adapted to the second LED structure.

12. The matrix according to claim 11, wherein the matrix comprises a third mesa covered with a third LED structure, having a third emission wavelength, for example green, so as to advantageously form an RGB matrix.

13. The matrix according to claim 11, wherein:

the first LED structure comprises the first $In(x_1)GaN$ layer in contact with the epitaxial regrowth layer of the first series of mesas, where $x_1$ has a value chosen in the range from 0 to 3%, and/or the second LED structure comprises the first $In(x_2)GaN$ layer in contact with the epitaxial regrowth layer of the second series of mesas, where $x_2$ has a value chosen in the range from 5 to 8%, and/or an optional third LED structure comprises a first $In(x_3)$ GaN layer in contact with the epitaxial regrowth layer of the third series of mesas, where $x_3$ has a value chosen in the range from 10 to 15%.

14. The matrix according to claim 13, wherein:

the first LED structure comprises the first $In(x_1)GaN$ layer, where $x_1$ is a value chosen in the range from 0 to 3%, for example 3%, $In_{0.15}Ga_{0.85}N/In_{0.03}Ga_{0.97}N$ quantum wells and a doped p-type GaN layer, and/or the second LED structure comprises the first $In(x_2)GaN$ layer, where $x_2$ is a value chosen in the range from 5 to 8%, for example 8%, $In_{0.25}Ga_{0.75}N/In_{0.08}Ga_{0.92}N$ quantum wells- and a doped p-type InGaN layer, and/or the optional third LED structure comprises the first $In(x_3)$ GaN layer, where $x_3$ is a value chosen in the range from 10 to 15%, for example 15%, $In_{0.40}Ga_{0.60}N/In_{0.15}Ga_{0.85}N$ quantum wells and a doped p-type InGaN layer.

15. The matrix according to claim 13, wherein the first layer of the first LED structure, and/or the first layer of the second LED structure and/or the first layer of the third LED structure has a thickness of between 50 and 200 nm.

* * * * *